(12) United States Patent
Uchino et al.

(10) Patent No.: US 11,183,119 B2
(45) Date of Patent: Nov. 23, 2021

(54) DISPLAY APPARATUS INCLUDING PIXEL CIRCUIT WITH TRANSISTORS CONNECTED TO DIFFERENT CONTROL LINES

(71) Applicant: Sony Group Corporation, Tokyo (JP)

(72) Inventors: Katsuhide Uchino, Kanagawa (JP); Junichi Yamashita, Tokyo (JP); Tetsuro Yamamoto, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

(21) Appl. No.: 16/296,757

(22) Filed: Mar. 8, 2019

(65) Prior Publication Data

US 2019/0266951 A1 Aug. 29, 2019

Related U.S. Application Data

(63) Continuation of application No. 15/869,738, filed on Jan. 12, 2018, now Pat. No. 10,276,102, which is a
(Continued)

(30) Foreign Application Priority Data

Jun. 2, 2004 (JP) ................................. 2004-164681
Jun. 2, 2004 (JP) ................................. 2004-164682

(51) Int. Cl.
*G09G 3/3258* (2016.01)
*G09G 3/20* (2006.01)
(Continued)

(52) U.S. Cl.
CPC ......... *G09G 3/3258* (2013.01); *G02B 6/4214* (2013.01); *G02B 6/4268* (2013.01);
(Continued)

(58) Field of Classification Search
CPC ....................................................... G09G 3/30
See application file for complete search history.

(56) References Cited

U.S. PATENT DOCUMENTS 6,201,270 B1 3/2001 Chen
6,229,506 B1 5/2001 Dawson et al.
(Continued)

FOREIGN PATENT DOCUMENTS

JP 2001-060076 A 3/2001
JP 2001-083924 3/2001
(Continued)

OTHER PUBLICATIONS

Japanese of Office Action No. JP 2004-164681 dated Nov. 13, 2007.
(Continued)

*Primary Examiner* — William Boddie
*Assistant Examiner* — Andrew B Schnirel
(74) *Attorney, Agent, or Firm* — Michael Best & Friedrich LLP

(57) ABSTRACT

A pixel circuit having a function of compensating for characteristic variation of an electro-optical element and threshold voltage variation of a transistor is formed from a reduced number of component elements. An input signal is sampled from a signal line so as to be held in a holding capacitor. The threshold voltage of the drive transistor is imparted to the holding capacitor in order to cancel an influence of the threshold voltage.

10 Claims, 15 Drawing Sheets

Related U.S. Application Data continuation of application No. 15/260,878, filed on Sep. 9, 2016, now Pat. No. 10,002,567, which is a continuation of application No. 14/994,509, filed on Jan. 13, 2016, now Pat. No. 9,454,929, which is a continuation of application No. 11/702,069, filed on Feb. 5, 2007, now Pat. No. 9,454,928, which is a continuation of application No. 11/140,199, filed on May 31, 2005, now Pat. No. 7,173,590.

(51) Int. Cl.

| | |
|---|---|
| G09G 3/3233 | (2016.01) |
| G09G 3/30 | (2006.01) |
| G09G 3/3266 | (2016.01) |
| G02B 6/42 | (2006.01) |
| H04B 10/50 | (2013.01) |
| G09G 3/3291 | (2016.01) |

(52) U.S. Cl.
CPC ............ *G09G 3/20* (2013.01); *G09G 3/2011* (2013.01); *G09G 3/30* (2013.01); *G09G 3/3233* (2013.01); *G09G 3/3266* (2013.01); *H04B 10/501* (2013.01); *G02B 6/4272* (2013.01); *G09G 3/3291* (2013.01); *G09G 2300/0417* (2013.01); *G09G 2300/0809* (2013.01); *G09G 2300/0819* (2013.01); *G09G 2300/0842* (2013.01); *G09G 2300/0852* (2013.01); *G09G 2300/0861* (2013.01); *G09G 2310/0216* (2013.01); *G09G 2310/0256* (2013.01); *G09G 2310/0267* (2013.01); *G09G 2320/043* (2013.01); *G09G 2320/045* (2013.01); *G09G 2320/0626* (2013.01); *G09G 2320/0633* (2013.01); *G09G 2330/021* (2013.01); *H01L 2224/16225* (2013.01); *H01L 2924/15192* (2013.01); *H01L 2924/15311* (2013.01)

(56) References Cited

U.S. PATENT DOCUMENTS

| 6,693,388 | B2 | 2/2004 | Oomura |
| 7,173,590 | B2 | 2/2007 | Uchino et al. |
| 7,307,463 | B2 | 12/2007 | Miyake et al. |
| 7,612,749 | B2 | 11/2009 | Libsch et al. |
| 7,659,872 | B2 | 2/2010 | Yamashita et al. |
| 7,876,294 | B2 | 1/2011 | Sasaki et al. |
| 2003/0016190 | A1 | 1/2003 | Kondo |
| 2003/0090481 | A1 | 5/2003 | Kimura |
| 2003/0095087 | A1 | 5/2003 | Libsch et al. |
| 2003/0112205 | A1 | 6/2003 | Yamada |
| 2004/0174354 | A1 | 9/2004 | Ono et al. |
| 2004/0201412 | A1 | 10/2004 | Miyake et al. |
| 2004/0201581 | A1 | 10/2004 | Miyazawa |
| 2004/0257353 | A1 | 12/2004 | Imamura et al. |
| 2005/0206590 | A1 | 9/2005 | Sasaki et al. |
| 2005/0259051 | A1 | 11/2005 | Lee et al. |
| 2005/0269959 | A1 | 12/2005 | Uchino et al. |
| 2006/0007072 | A1 | 1/2006 | Choi et al. |
| 2006/0077134 | A1 | 4/2006 | Hector et al. |
| 2006/0176250 | A1 | 8/2006 | Nathan et al. |
| 2007/0103419 | A1 | 5/2007 | Uchino et al. |
| 2007/0132694 | A1 | 6/2007 | Uchino et al. |
| 2007/0164962 | A1 | 7/2007 | Uchino et al. |

FOREIGN PATENT DOCUMENTS

| JP | 2003-195809 | | 7/2003 |
| JP | 2003-216110 | A | 7/2003 |
| JP | 2003-255856 | A | 9/2003 |
| JP | 2003-255897 | A | 9/2003 |
| JP | 2003-271095 | A | 9/2003 |
| JP | 2004-280059 | A | 10/2004 |
| JP | 2005-345722 | | 12/2005 |
| WO | WO-02/075709 | A1 | 9/2002 |
| WO | WO-2003/075256 | A1 | 9/2003 |
| WO | WO-2004/023444 | A1 | 3/2004 |

OTHER PUBLICATIONS

Japanese Office Action No. 2004-164682 dated Nov. 13, 2007.
Notification of Reasons for Refusal; Patent Application No. 2004-164681; Reference No. 0490211703; Dispatch No. 571862; dated Nov. 13, 2007.
Notification of Reasons for Refusal; Patent Application No. 2004-164682; Reference No. 0490212203; Dispatch No. 571861; dated Nov. 13, 2007.
Japanese Office Action dated Nov. 16, 2010 for corresponding Japanese Application No. 2008-175138.
Japanese Office Action dated Nov. 16, 2010 for corresponding Japanese Application No. 2008-005042.
He, Yi, et al., Current-Source a--Si:H Thin-Film Transistor Circuit for Active-Matrix Organic Light-Emitting Displays, IEEE Electron Device Letters, vol. 21, No. 12 Dec. 2000.
Japanese Office Action dated Sep. 13, 2011 for corresponding Japanese Application 2008-005042.

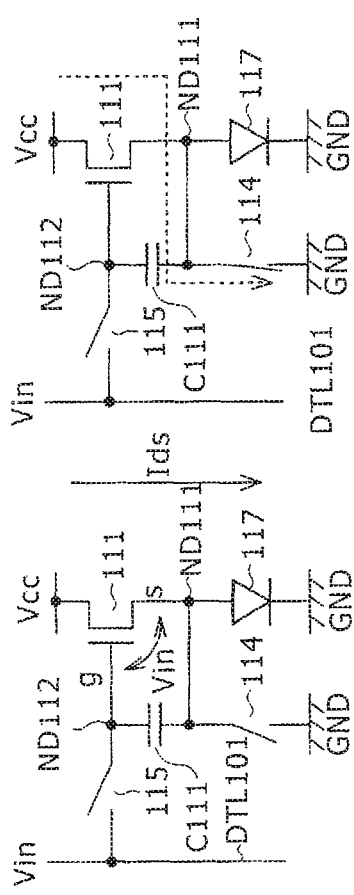
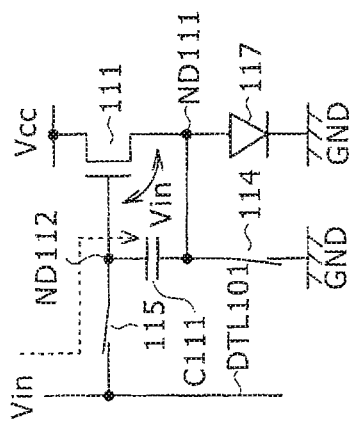
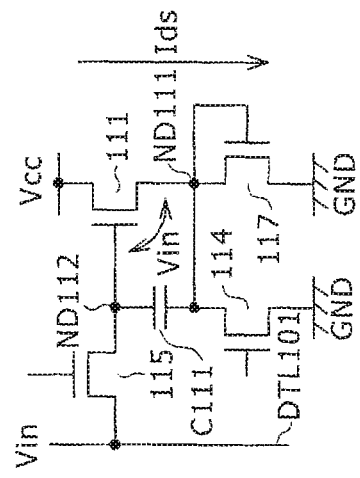
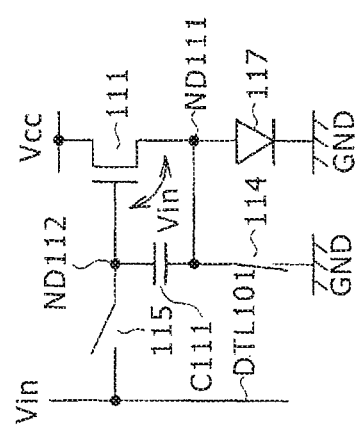

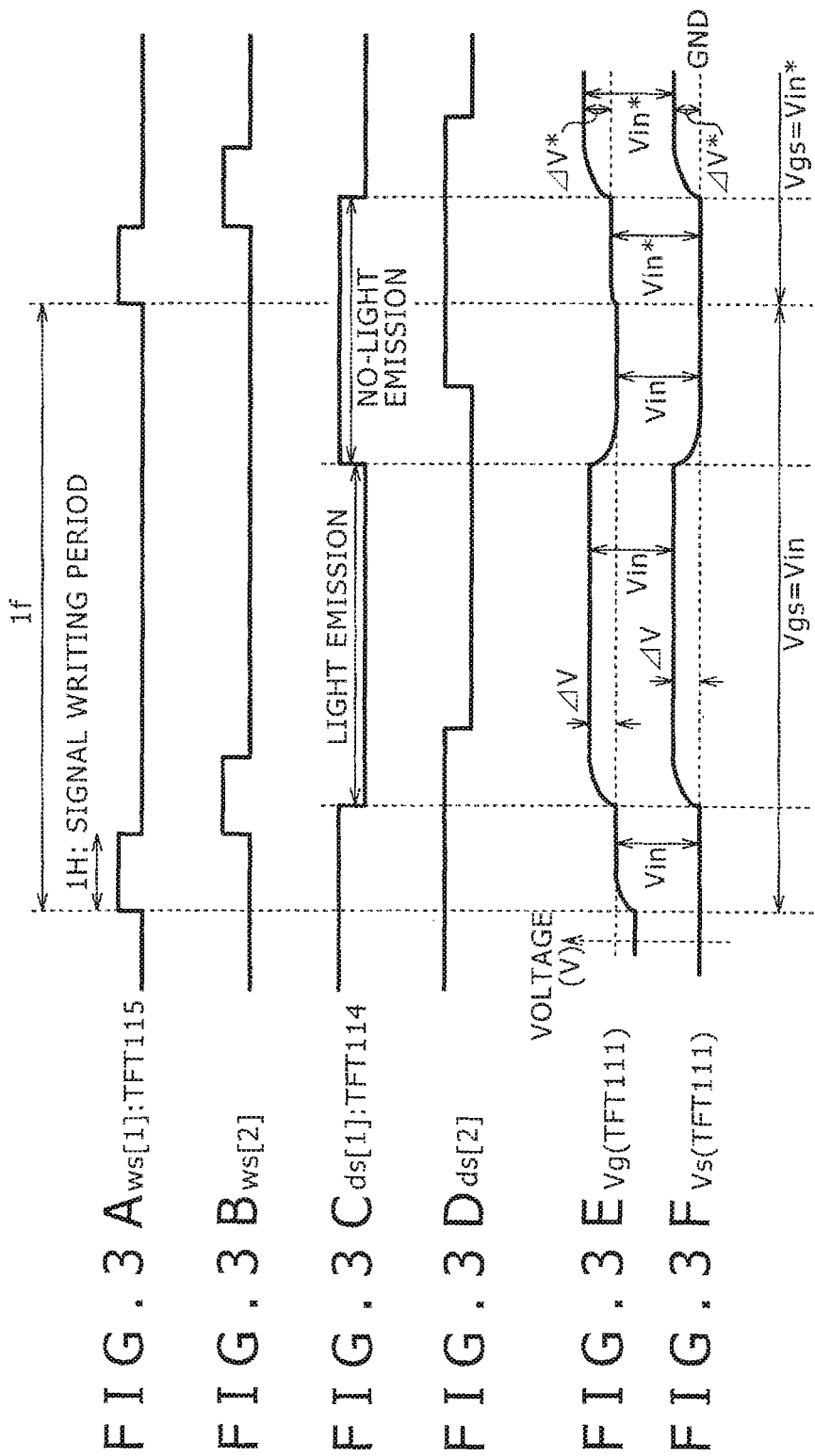

VARIATION OF I-V CHARACTERISTIC
OF EL ELEMENT WITH RESPECT TO TIME

—————— INITIAL STATE
·············· AFTER SECULAR CHANGE

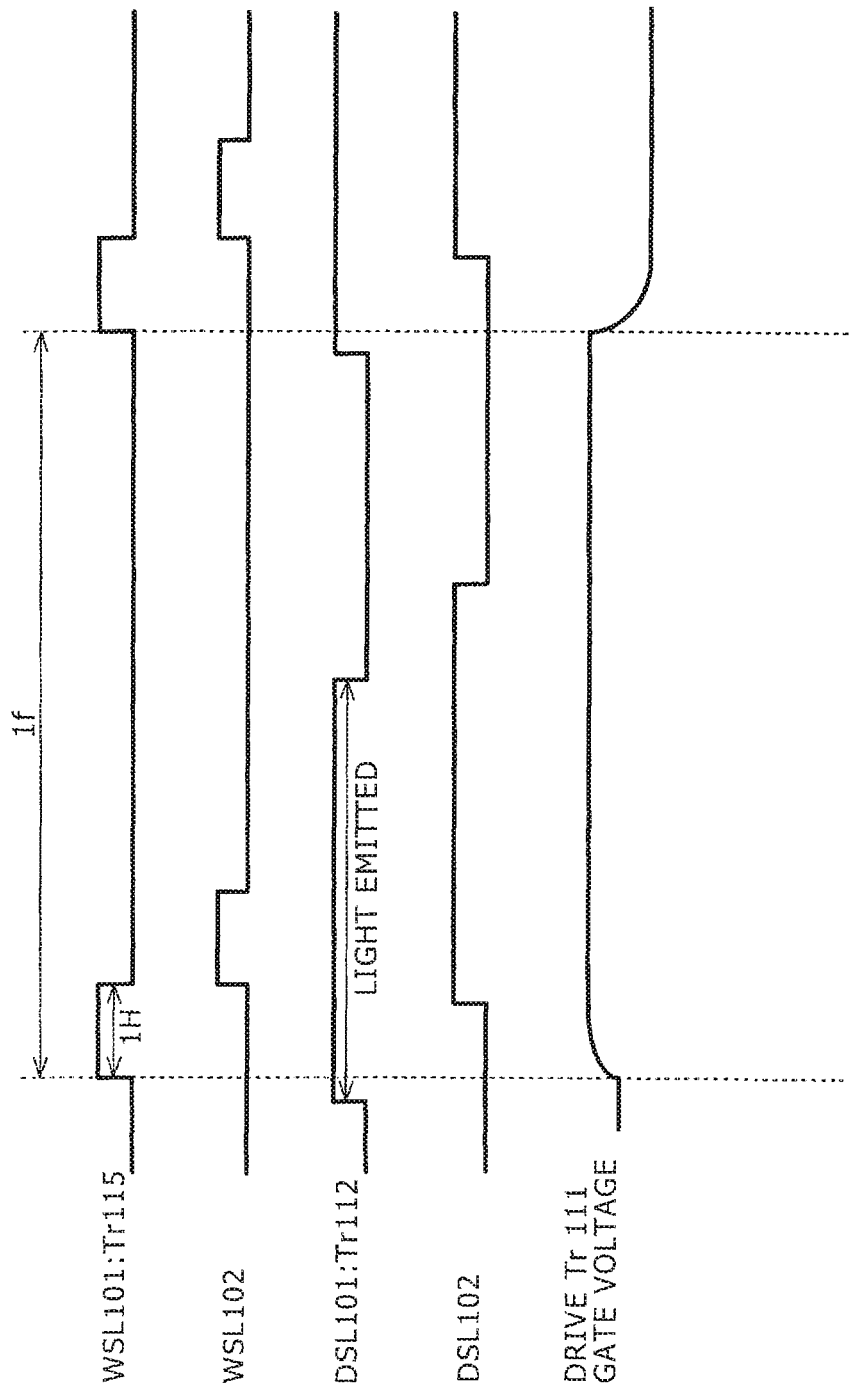

DISPLAY APPARATUS INCLUDING PIXEL CIRCUIT WITH TRANSISTORS CONNECTED TO DIFFERENT CONTROL LINES

CROSS REFERENCE TO RELATED APPLICATIONS

This is a Continuation Application of U.S. patent application Ser. No. 15/869,738, filed Jan. 12, 2018, which is a Continuation Application of U.S. patent application Ser. No. 15/260,878, filed Sep. 9, 2016, now U.S. Pat. No. 10,002,567, issued on Jun. 19, 2018, which is a Continuation Application of U.S. patent application Ser. No. 14/994,509, filed Jan. 13, 2016, now U.S. Pat. No. 9,454,929, issued on Sep. 27, 2016, which is Continuation Application of U.S. patent application Ser. No. 11/702,069, filed Feb. 5, 2007, now U.S. Pat. No. 9,454,928, issued on Sep. 27, 2016, which is a Continuation Application of U.S. patent application Ser. No. 11/140,199, filed May 31, 2005, now U.S. Pat. No. 7,173,590, issued on Feb. 6, 2007, which claims priority from Japanese Patent Applications JP 2004-164681 and JP 2004-164682, both filed with the Japanese Patent Office on Jun. 2, 2004 the entire contents of which being incorporated herein by reference.

BACKGROUND OF THE INVENTION

This invention relates to a pixel circuit wherein a load element disposed for each pixel is driven by current and also to a matrix apparatus wherein a plurality of pixel circuits are disposed in a matrix and particularly to an active matrix apparatus wherein an amount of current to be supplied to a load element is controlled by an insulating gate type field effect transistor provided in each pixel circuit. The present invention further relates to a display apparatus of the active matrix type which includes an electro-optical element whose luminance is controlled by a value of current such as an organic EL element as a load element.

In an image display apparatus such as, for example, a liquid crystal display apparatus, a large number of liquid crystal elements are juxtaposed in a matrix and the transmission intensity or reflection intensity of incoming light is controlled for each pixel in response to image information to be displayed thereby to display an image. Although this similarly applies to an organic EL display apparatus which uses an organic EL element for a pixel or a like apparatus, different from a liquid crystal element, an organic EL element is a self light emitting element. Therefore, the organic EL display apparatus is advantageous in that the image displayed thereon is higher in visibility than that on the liquid crystal display apparatus, that no backlight is required and that the responding speed is high. Further, the organic EL display apparatus is much different from the liquid crystal display apparatus in that the luminance level (gradation) of each light emitting element is of the current controlled type wherein it can be controlled by the value of current flowing therethrough.

For the organic EL display apparatus, two different driving methods are available including a simple matrix type driving method and an active matrix type driving method similarly to the liquid crystal display apparatus. The former has a problem that implementation of a display apparatus of a large size and a high definition is difficult although it is simple in structure. Therefore, development of organic EL display apparatus which uses the active matrix type driving method is proceeding energetically. According to the active matrix type driving method, current to flow to a light emitting element in the inside of each pixel circuit is controlled by an active element (usually a thin film transistor: TFT) provided in the pixel circuit.

Organic EL display apparatus of the type described are disclosed, for example, in Japanese Patent Laid-Open Nos. 2003-255856 and 2003-271095.

FIG. 10 shows a configuration of an exemplary organic EL display apparatus. Referring to FIG. 10, the display apparatus 100 shown includes a pixel array section 102 in which pixel circuits (PXLC) 101 are arranged in an m×n matrix, a horizontal selector (HSEL) 103, a write scanner (WSCN) 104, and a drive scanner (DSCN) 105. The display apparatus 100 further includes signal lines DTL101 to DTL10n for being selected by the horizontal selector 103 such that a signal based on luminance information is supplied thereto, scanning lines WSL101 to WSL10m for being selectively driven by the write scanner 104, and scanning lines DSL101 to DSL10m for being selectively driving by the drive scanner 105.

FIG. 11 shows an example of a configuration of a pixel circuit shown in FIG. 10. Referring to FIG. 11, the pixel circuit 101 shown is basically formed using a thin film field effect transistor (hereinafter referred to as TFT) of the p-channel type. In particular, the pixel circuit 101 includes a drive TFT 111, a switching TFT 112, a sampling TFT 115, an organic EL element 117, and a holding capacitor C111. The pixel circuit 101 formed from the elements mentioned is disclosed at an intersecting point of a signal line DTL101 with a scanning line WSL101 and a signal line DTL101. The signal line DTL101 is connected to the drain of the sampling TFT 115 while the scanning line WSL101 is connected to the gate of the sampling TFT 115, and the other scanning line DSL101 is connected to the gate of the switching TFT 112.

The drive TFT 111, switching TFT 112 and organic EL element 117 are connected in series between a power supply potential Vcc and a ground potential GND. In particular, the source of the drive TFT 111 is connected to the power supply potential Vcc, and the cathode of the organic EL element 117 (light emitting element) is connected to the ground potential GND. Since the organic EL element 117 generally has a rectifying action, it is represented by a mark of a diode. Meanwhile, the sampling TFT 115 and the holding capacitor C111 are connected to the gate of the drive TFT 111. The gate-source voltage of the drive TFT 111 is represented by Vgs.

In operation of the pixel circuit 101, the scanning line WSL101 is first placed into a selection condition (here, the low level) and a signal is applied to the signal line DTL101. Thereupon, the sampling TFT 115 is rendered conducting so that the signal is written into the holding capacitor C111. The signal potential written in the holding capacitor C111 acts as the gate potential to the drive TFT 111. Then, the scanning line WSL101 is placed into a non-selection state (here, the high level). Consequently, the signal line DTL101 and the drive TFT 111 are electrically disconnected from each other. However, the gate potential Vgs of the drive TFT 111 is held stably by the holding capacitor C111. Thereafter, the other scanning line DSL101 is placed into a selection state (here, the low level). Consequently, the switching TFT 112 is rendered conducting, and driving current flows from the power supply potential Vcc toward the ground potential GND through the TFTs 111 and 112 and light emitting element 117. Then, when the scanning line DSL101 is placed into a non-selection state, the switching TFT 112 is turned off, and the driving current does not flow any more.

The switching TFT 112 is inserted in order to control the time of light emission of the light emitting element 117.

The current flowing through the TFT 111 and the light emitting element 117 has a value corresponding to the gate-source voltage Vgs of the drive TFT 111, and the light emitting element 117 continues to emit light with a luminance corresponding to the current value. Such operation of selecting the scanning line WSL101 to transmit a signal applied to the signal line DTL101 to the inside of the pixel circuit 101 is hereinafter referred to as "writing". If writing of a signal is performed once as described above, then the light emitting element 117 continues to emit light with a fixed luminance for a period of time until writing into the organic EL element 117 is performed subsequently.

As described above, the value of current to flow to the light emitting element 117 is controlled by adjusting the voltage to be applied to the gate of the TFT 111 serving as a drive transistor in response to an input signal. At this time, since the source of the p-channel drive transistor 111 is connected to the power supply potential Vcc, the TFT 111 normally operates in a saturation region. Consequently, the drive transistor 111 serves as a current source having a current value given by the following expression (1):

$$Ids=(½)·μ·(W/L)·Cox·(Vgs-Vth)2 \quad (1)$$

where Ids is the current flowing between the drain-source of the transistor which operates in a saturation region, μ the mobility, W the channel width, L the channel length, Cox the gate capacitance, and Vth the threshold value of the transistor. As apparent from the expression (1), in a saturation region of the transistor, the drain current Ids of the transistor is controlled by the gate-source voltage Vgs. Since the gate-source voltage Vgs of the drive transistor 111 shown in FIG. 11 is held fixed, the drive transistor 111 operates as a constant current source and can cause the light emitting element 117 to emit light with a fixed luminance.

FIG. 12 is a graph illustrating aged deterioration of the current-voltage (I-V) characteristic of an organic EL element. In the graph, a curve indicated by a solid line represents the characteristic in an initial state, and another curve which is indicated by a broken line represents the characteristic after aged deterioration. Usually, the I-V characteristic of an organic EL element deteriorates with time as seen from the graph. However, in the pixel circuit shown in FIG. 11, since the drive transistor is driven by constant current, the drain current Ids continues to flow through the organic EL element, and even if the I-V characteristic of the organic EL element deteriorates, the luminance of emitted light of the organic EL element does not deteriorate with time.

SUMMARY OF THE INVENTION

While the pixel circuit shown in FIG. 11 is formed using a p-channel TFT, if it can be formed otherwise using an n-channel TFT, then a conventional amorphous silicon (a-Si) process can be applied to TFT production. This makes it possible to reduce the cost of a TFT substrate, and it is expected to develop a pixel circuit formed using an n-channel TFT.

FIG. 13 is a circuit diagram showing a configuration wherein the p-channel TFTs of the pixel circuit shown in FIG. 11 are replaced by n-channel TFTs. Referring to FIG. 13, the pixel circuit 101 shown includes n-channel TFTs 111, 112 and 115, a holding capacitor C111 and an organic EL element 117 which is a light emitting element. The TFT 111 is a drive transistor, and the TFT 112 is a switching transistor while the TFT 115 is a sampling transistor. Further, in FIG. 13, reference character DTL101 denotes a signal line, and reference characters DSL101 and WSL101 denote each a scanning line. Further, in the pixel circuit 101, the drain of the TFT 111 as a drive transistor is connected to a power supply potential Vcc and the source of the TFT 111 is connected to the anode of the organic EL element 117 thereby to form a source follower circuit.

FIG. 14 is a timing chart illustrating operation of the pixel circuit shown in FIG. 13. Referring to FIG. 14, if a selection pulse is applied to the scanning line WSL101, then the sampling TFT 115 is rendered conducting and samples and writes a signal from the signal line DTL101 into the holding capacitor C111. Consequently, the gate potential of the drive TFT 111 is held at the sampled signal potential. This sampling operation is performed line sequentially. In particular, after a selection pulse is applied to the scanning line WSL101 of the first row, another selection pulse is applied to the scanning line WSL102 of the second row, and thereafter, pixels for one row are selected for each one horizontal period (1H). Since also the scanning line DSL101 is selected simultaneously with the selection of the scanning line WSL101, the switching TFT 112 is turned on. Consequently, driving current flows to the light emitting element 117 through the drive TFT 111 and the switching TFT 112 so that light is emitted from the light emitting element 117. Intermediately within one field period (1f), the scanning line DSL101 is placed into a non-selection state, and the switching TFT 112 is turned off. Consequently, the emission of light is stopped. The scanning line DSL101 controls the period of time (duty) of light emission which occupies the one field period.

FIG. 15A is a graph illustrating a working point of the drive transistor 111 and the EL element 117 in the initial state. Referring to FIG. 13a, the axis of abscissa indicates the drain-source voltage Vds of the drive transistor 111, and the axis of ordinate indicates the drain current Ids. As seen in FIG. 13a, the source potential depends upon the working point of the drive transistor 111 and the EL element 117, and the voltage of the source potential has a value which is different depending upon the gate voltage. Since the drive transistor 111 is driven in the saturation region, the drain current Ids of the current value defined by the expression (1) given hereinabove with respect to the gate-source voltage Vgs corresponding to the source voltage of the working point is supplied.

However, the I-V characteristic of the EL element deteriorates with time as described hereinabove. As seen in FIG. 15B, the aged deterioration changes the working point, and even if an equal gate voltage is applied, the source voltage of the transistor changes. Consequently, the gate-source voltage Vgs of the drive transistor 111 changes, and the value of flowing current varies. Simultaneously, also the value of current flowing though the EL element 117 varies. In this manner, the pixel circuit of a source follower configuration shown in FIG. 13 has a subject to be solved that, if the I-V characteristic of the organic EL element changes, then the luminance of light emission of the organic EL element varies with time.

It is to be noted that also it is a possible idea to dispose the drive TFT 111 and the EL element 117 reversely in order to eliminate the subject described above. In particular, according to the possible circuit configuration just mentioned, the source of the drive transistor 111 is connected to the ground potential GND and the drain of the drive transistor 111 is connected to the cathode of the EL element 117 while the anode of the EL element 117 is connected to the power supply potential Vcc. In the circuit configuration described, the potential of the source of the drive transistor 111 is fixed and the drive transistor 111 operates as a constant current source similarly as in the pixel circuit of the p-channel TFT configuration described hereinabove with reference to FIG. 11. Consequently, also a luminance variation by deterioration of the I-V characteristic of the EL element can be prevented. However, according to the circuit configuration, it is necessary to connect the drive transistor to the cathode side of the EL element. Such cathode connection requires development of a novel anode electrode and cathode electrode, and it is considered that this is very difficult with the technique at present. From the foregoing situation, the conventional technique fails to place an organic EL display apparatus which uses an n-channel transistor and does not exhibit a luminance variation into practical use.

In an organic EL display apparatus of the active matrix type, also the threshold voltage of n-channel TFTs which form the pixel circuit varies with time in addition to the characteristic variation of the EL element. As is apparent from the expression (1) given hereinabove, if the threshold voltage Vth of the drive transistor varies, then the drain current Ids changes. Consequently, there is a subject to be solved that the luminance of emitted light varies by variation of the threshold voltage Vth.

Therefor, it is desirable to provide a pixel circuit by which the luminance of light to be emitted can be kept fixed even if the I-V characteristic of a load element of the current driven type (an electro-optical element such as, for example, an organic EL element) such as a light emitting element varies with time.

It is also desirable to provide a pixel circuit wherein a load element can be driven stably even if the threshold voltage of a transistor which forms the pixel circuit varies with time.

It is further desirable to provide a pixel circuit having a function of compensating for a characteristic variation of a load element and another function of compensating for a variation of the threshold voltage of a transistor wherein the number of circuit components necessary to provide the compensation functions is reduced to the utmost.

According to an embodiment of the present invention, there is provided a pixel circuit disposed at a point at which a scanning line and a signal line intersect with each other, including an electro-optical element, a holding capacitor, and a drive transistor, wherein an input signal from said signal line is sampled into said holding capacitor, and said drive transistor applies current to said electro-optical element depending on the input signal held by said holding capacitor, said drive transistor having a threshold voltage that is imparted to said holding capacitor in association with sampling said input signal into said holding capacitor.

According to certain embodiments of the present invention, the pixel circuit includes an electro-optical element, a holding capacitor, and a drive transistor. The pixel circuit has a bootstrap function of the holding capacitor, and therefore, even if the I-V characteristic of an electro-optical element of a current driven type such as a light emitting element varies with time, the luminance of light emission can be kept fixed. Further, the threshold voltage of the drive transistor is detected and the variation of the threshold voltage of the drive transistor is compensated for. Consequently, the electro-optical element can be driven stably. Particularly, the pixel circuit has a reasonable configuration which includes a minimized number of circuit elements. As the number of component elements is small, the yield is enhanced and reduction in cost can be anticipated.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIGS. 2A to 2F are circuit diagrams illustrating operation of the pixel circuit shown in FIG. 1;

FIG. 3A to 3F is a timing chart illustrating operation of the pixel circuit shown in FIG. 1;

FIG. 14 is a timing chart illustrating operation of the pixel circuit shown in FIG. 13.

DETAILED DESCRIPTION OF THE PREFERRED EMBODIMENTS

Figure 1:
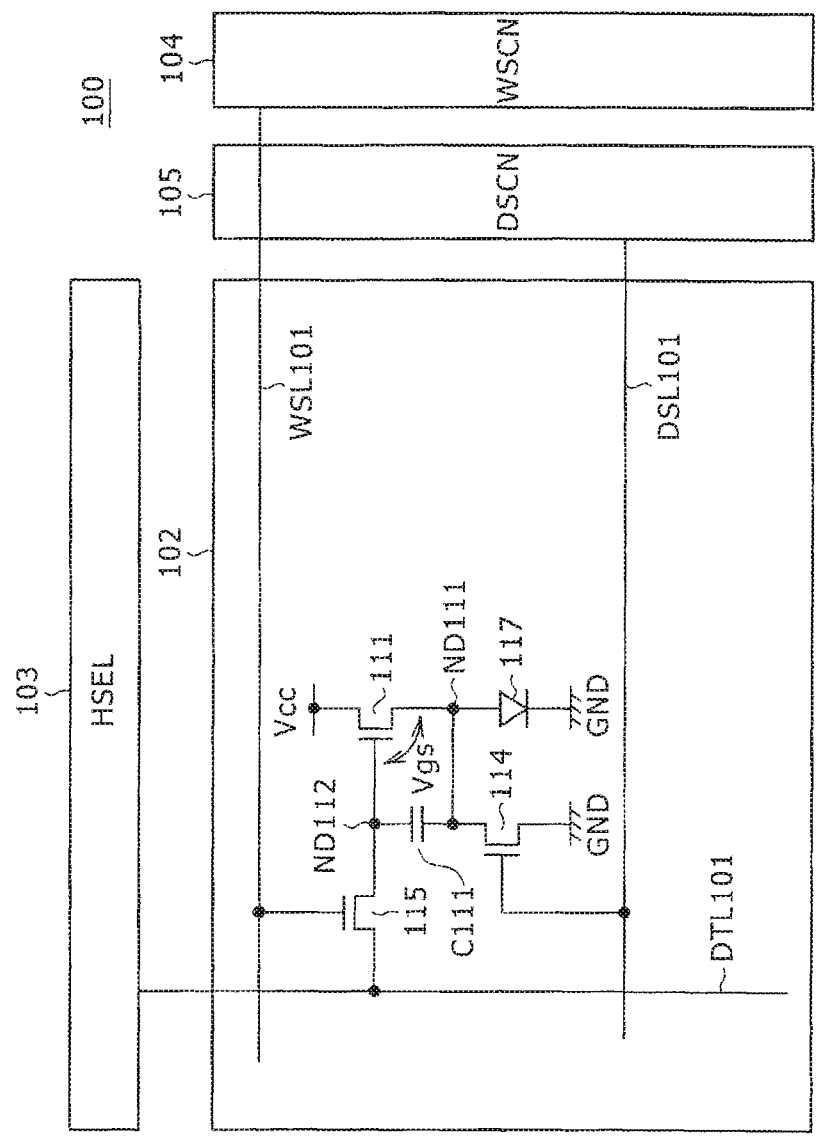
FIG. 1 is a block diagram showing an example of a pixel circuit.

Now, preferred embodiments of the present invention are described in detail with reference to the accompanying drawings. For the convenience of description, a pixel circuit which has a characteristic variation compensation function (bootstrap function) of a light emitting element serving as a load element is described first, and then, another pixel circuit which additionally has a threshold voltage variation compensation function of a drive transistor is described. Thereafter, further pixel circuits which have such compensation functions as mentioned above while they are composed of a minimized number of circuit components are described. FIG. 1 shows a configuration of a display apparatus which includes a pixel circuit having a bootstrap function which is a compensation function for a characteristic variation of a light emitting element which is an electro-optical element. It is to be noted that the circuit configuration shown in FIG. 1 is disclosed in Japanese Patent Application No. 2003-146758 filed on May 23, 2003 in Japan, as well as corresponding International Application No. PCT/JP2004/007304 filed on May 21, 2004 and U.S. application Ser. No. 10/557,800, filed on Nov. 18, 2005, all of which are commonly owned by the assignee of the present patent application.

Referring to FIG. 1, the display apparatus 100 shown includes a pixel array section 102 in which pixel circuits (PXLC) 101 are arranged in a matrix, a horizontal selector (HSEL) 103, a write scanner (WSCN) 104, and a drive scanner (DSCN) 105. The display apparatus 100 further includes signal lines DTL101 to DTL10n for being selected by the horizontal selector 103 such that a signal based on luminance information is supplied thereto, scanning lines WSL101 to WSL10m for being selectively driven by the write scanner 104, and scanning lines DSL101 to DSL10m for being selectively driving by the drive scanner 105. It is to be noted that, for the simplified illustration, a particular configuration of one pixel circuit is shown in FIG. 1.

The pixel circuit 101 includes n-channel TFTs 111 to 115, a capacitor C111, a light emitting element 117 formed from an organic EL element (OLED: Organic Light Emitting Diode), and nodes ND111 and ND112. Further, in FIG. 1, reference character DTL101 denotes a signal line, WSL101 a scanning line, and DSL101 another scanning line. Of the components, the TFT 111 serves as a driving field effect transistor; the sampling TFT 115 serves as a first switch; the TFT 114 serves as a second switch; and the capacitor C111 serves as a holding capacitance element.

In the pixel circuit 101, the light emitting element (OLED) 117 is interposed between the source of the TFT 111 and a ground potential GND. More particularly, the anode of the light emitting element 117 is connected to the source of the TFT 111, and the cathode side of the light emitting element 117 is connected to the ground potential GND. The node ND111 is formed from a connecting point between the anode of the light emitting element 117 and the source of the TFT 111. The source of the TFT 111 is connected to the drain of the TFT 114 and a first electrode of the capacitor C111, and the gate of the TFT 111 is connected to the node ND112. The source of the TFT 114 is connected to a fixed potential (in the present embodiment, the ground potential GND), and the gate of the TFT 114 is connected to the scanning line DSL101. The second electrode of the capacitor C111 is connected to the node ND112. The source and the drain of the sampling TFT 115 are connected to the signal line DTL101 and the node ND112, respectively. The gate of the TFT 115 is connected to the scanning line WSL101.

In this manner, the pixel circuit 101 according to the present embodiment is configured such that the capacitor C111 is connected between the gate and the source of the TFT 111 serving as a drive transistor so that the source potential of the TFT 111 is connected to the fixed potential through the TFT 114 serving as a switching transistor.

Now, operation of the display apparatus 100 having the configuration described above is described with reference to FIGS. 2A to 2F and 3A to 3F principally in connection to operation of the pixel circuit. It is to be noted that FIG. 3A illustrates a scanning signal ws[1] applied to the scanning line WSL101 of the first row of the pixel array; FIG. 3B illustrates another scanning signal ws[2] applied to the scanning line WSL102 of the second row of the pixel array; FIG. 3C illustrates a driving signal ds[1] applied to the scanning line DSL101 of the first row of the pixel array; FIG. 3D illustrates another driving signal ds[2] applied to the scanning line DSL102 of the second row of the pixel array; FIG. 3E illustrates a gate potential Vg (node ND112) of the TFT 111; and FIG. 3F illustrates the source potential Vs (node ND111) of the TFT 111.

First, in an ordinary light emitting state of the EL light emitting element 117, the scanning signals ws[1], ws[2], . . . to the scanning lines WSL101, WSL102, . . . are selectively set to the low level by the write scanner 104 and the driving signals ds[1], ds[2], . . . to the scanning lines DSL101, DSL102, . . . are selectively set to the low level by the drive scanner 105 as seen in FIGS. 3A to 3D. As a result, in the pixel circuit 101, the TFT 115 and the TFT 114 are held in an off state as seen in FIG. 2A.

Then, within a no-light emission period of the EL light emitting element 117, the scanning signals ws[1], ws[2], . . . to the scanning lines WSL101, WSL102, . . . are held at the low level by the write scanner 104 and the driving signals ds[1], ds[2], . . . to the scanning lines DSL101, DSL102, . . . are selectively set to the high level by the drive scanner 105 as seen in FIGS. 3A to 3D. As a result, in the pixel circuit 101, the TFT 114 is turned on while the TFT 115 is held in an off state as seen in FIG. 2B. Thereupon, current flows through the TFT 114, and the source potential Vs of the TFT 111 drops down to the ground potential GND as seen in FIG. 3F. Therefore, also the voltage applied to the light emitting element 117 drops to 0 V, and the light emitting element 117 is placed into a no-light emission state.

Thereafter, while the driving signals ds[1], ds[2], . . . to the scanning lines DSL101, DSL102, . . . are kept at the high level by the drive scanner 105, the scanning signals ws[1], ws[2], . . . to the scanning lines WSL101, WSL102, . . . are selectively set to the high level by the write scanner 104 as seen in FIGS. 3A to 3D. As a result, in the pixel circuit 101, while the TFT 114 is held in an on state, the TFT 115 is placed into an on state as seen in FIG. 2C. Consequently, an input signal (Vin) propagating to the signal line DTL101 by the horizontal selector 103 is written into the capacitor C111 as a holding capacitor. At this time, since the source potential Vs of the TFT 111 as a drive transistor is equal to the ground potential level (GND level), the potential difference between the gate and the source of the TFT 111 is equal to the signal Vin of the input signal.

Thereafter, within the no-light emission period of the light emitting element 117, while the driving signals ds[1], ds[2], . . . to the scanning lines DSL101, DSL102, . . . are held at the high level by the drive scanner 105, the scanning signals ws[1], ws[2], . . . to the scanning lines WSL101, WSL102, . . . are selectively set to the low level by the write scanner 104 as seen in FIGS. 3A to 3D. As a result, in the pixel circuit 101, the TFT 115 is placed into an off state as seen in FIG. 2D, and the writing of the input signal into the capacitor C111 as a holding capacitor is completed therewith.

Thereafter, the scanning signals ws[1], ws[2], . . . to the scanning lines WSL101, WSL102, . . . are held at the low level by the write scanner 104 and the driving signals ds[1], ds[2], . . . to the scanning lines DSL101, DSL102, . . . are selectively set to the low level by the drive scanner 105 as seen in FIGS. 3A to 3D. As a result, in the pixel circuit 101, the TFT 114 is placed into an off state as seen in FIG. 2E. After the TFT 114 is placed into an off state, the source potential Vs of the TFT 111 as a drive transistor rises, and current flows also to the light emitting element 117.

Although the source potential Vs of the TFT 111 varies, the gate-source voltage is normally held at the voltage Vin as seen in FIGS. 3E and 3F. At this time, since the TFT 111 as a drive transistor operates in a saturation region, the current value Ids flowing through the TFT 111 depends upon the voltage Vin which is the gate-source voltage of the TFT 111. The current Ids flows also to the light emitting element 117 similarly, and consequently, the light emitting element 117 emits light. An equivalent circuit of the light emitting element 117 is shown in FIG. 2F, and consequently, the potential at the node ND111 rises up to the gate potential with which the current Ids flows through the EL light emitting element 117. As the potential rises in this manner, also the potential at the node ND112 rises similarly through the capacitor C111 (holding capacitor). Consequently, the gate-source voltage of the TFT 111 is held at the voltage Vin as described hereinabove.

Usually, the I-V characteristic of an EL light emitting element deteriorates as the time of light emission therefrom increases. Therefore, even if the drive transistor supplies current of an equal value, the potential applied to the EL light emitting element varies and the potential at the node ND111 drops. However, in the present circuit, since the potential at the node ND111 drops while the gate-source voltage of the drive transistor is kept fixed, current to flow to the drive transistor (TFT 111) does not change. Consequently, also the current flowing to the EL light emitting element does not change, and even if the I-V characteristic of the EL light emitting element deteriorates, current corresponding to the input voltage Vin continues to flow.

As described above, in the present form for reference of the pixel circuit, the source of the TFT 111 as a drive transistor is connected to the anode of the light emitting element 117 while the drain of the TFT 111 is connected to the power supply potential Vcc, and the capacitor C111 is connected between the gate and the source of the TFT 111 such that the source potential of the TFT 111 is connected to the fixed potential through the TFT 114 as a switch transistor. Consequently, the following advantages can be anticipated. In particular, even if the I-V characteristic of the EL light emitting element varies with time, a source follower output free from deterioration in luminance can be obtained. Further, a source follower circuit of n-channel transistors can be implemented, and an n-channel transistor can be used as a driving element for the EL light emitting element while existing anode and cathode electrodes are used. Further, the transistors of the pixel circuit can be formed only from n-channel transistors, and consequently, the a-Si process can be used in TFT production. As a result, production of a TFT at a low cost can be anticipated.

Figure 4:
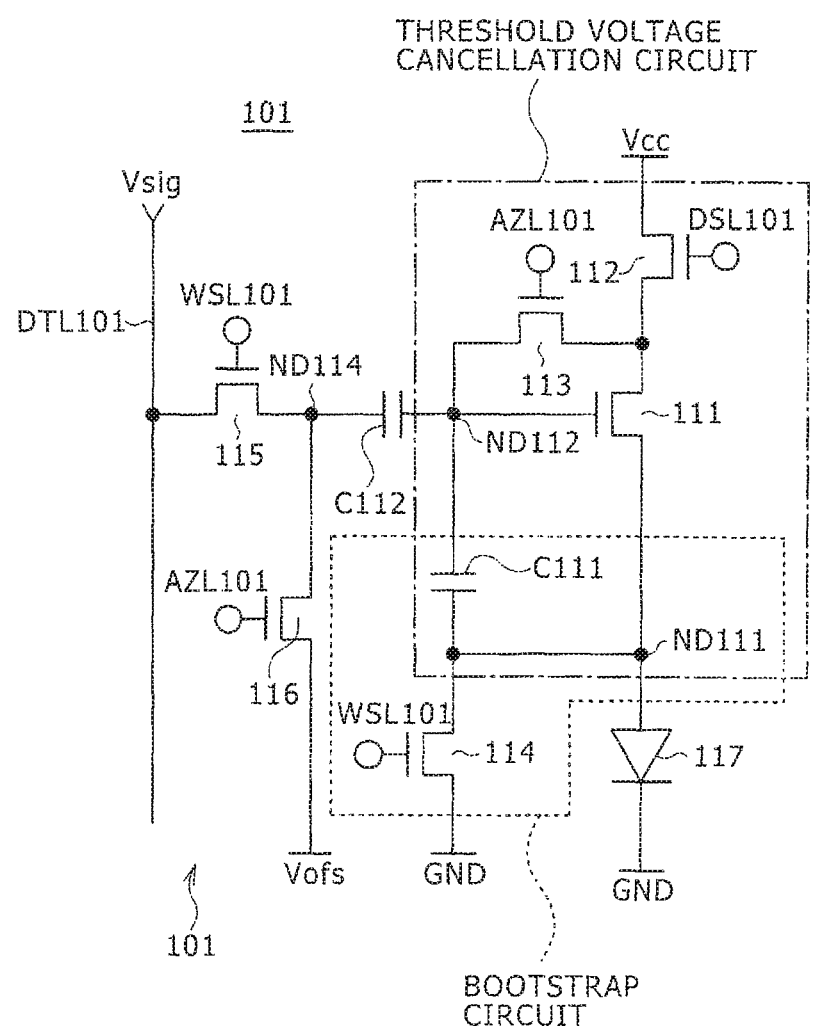
FIG. 4 is a circuit diagram showing another example of a pixel circuit.

FIG. 4 shows a configuration of a pixel circuit wherein a threshold voltage cancellation function is additionally provided for the pixel circuit having a bootstrap function described hereinabove with reference to FIG. 1. The pixel circuit shown in FIG. 4 is same as the pixel circuit disclosed in Japanese Patent Application No. 2003-159646 filed on Jun. 4, 2003 in Japan, as well as corresponding International Application No. PCT/JP2004/008055 filed on Jun. 3, 2004 and U.S. application Ser. No. 10/558,372, filed on Nov. 29, 2005, all of which are commonly owned by the assignee of the present patent application. The pixel circuit of FIG. 4 is basically formed from the pixel circuit of FIG. 1 to which a threshold voltage cancellation circuit is added. However, the scanning line WSL101 is connected in place of the scanning line DSL101 to the gate of the TFT 114 included in the bootstrap circuit to simplify the circuit configuration. It is basically necessary only to control the TFT 114 included in the bootstrap circuit so as to be switched on and off in synchronism with sampling of a video signal, and therefore, such simplification as described above is permitted. Naturally, a scanning line DSL101 for exclusive use may be connected to the gate of the TFT 114 similarly as in the example of FIG. 1.

Referring to FIG. 4, the threshold voltage cancellation circuit is basically includes a drive transistor 111, a switching transistor 112, an additional switching transistor 113, and a capacitor C111. In addition to the components of the threshold voltage cancellation circuit, the pixel circuit shown in FIG. 4 includes a coupling capacitor C112 and a switching transistor 116. The source/drain of the additionally provided switching transistor 113 are connected between the gate and the drain of the TFT 111. Further, the drain of the switching transistor 116 is connected to the drain of the TFT 115, and an offset voltage Vofs is supplied to the source of the switching transistor 116. The coupling capacitor C112 is interposed between a node ND114 on the TFT 115 side and the node ND112 on the drive transistor 111 side. A scanning line AZL101 for the cancellation of a threshold voltage (Vth) is connected to the gates of the switching transistors 113 and 116.

Figure 5:
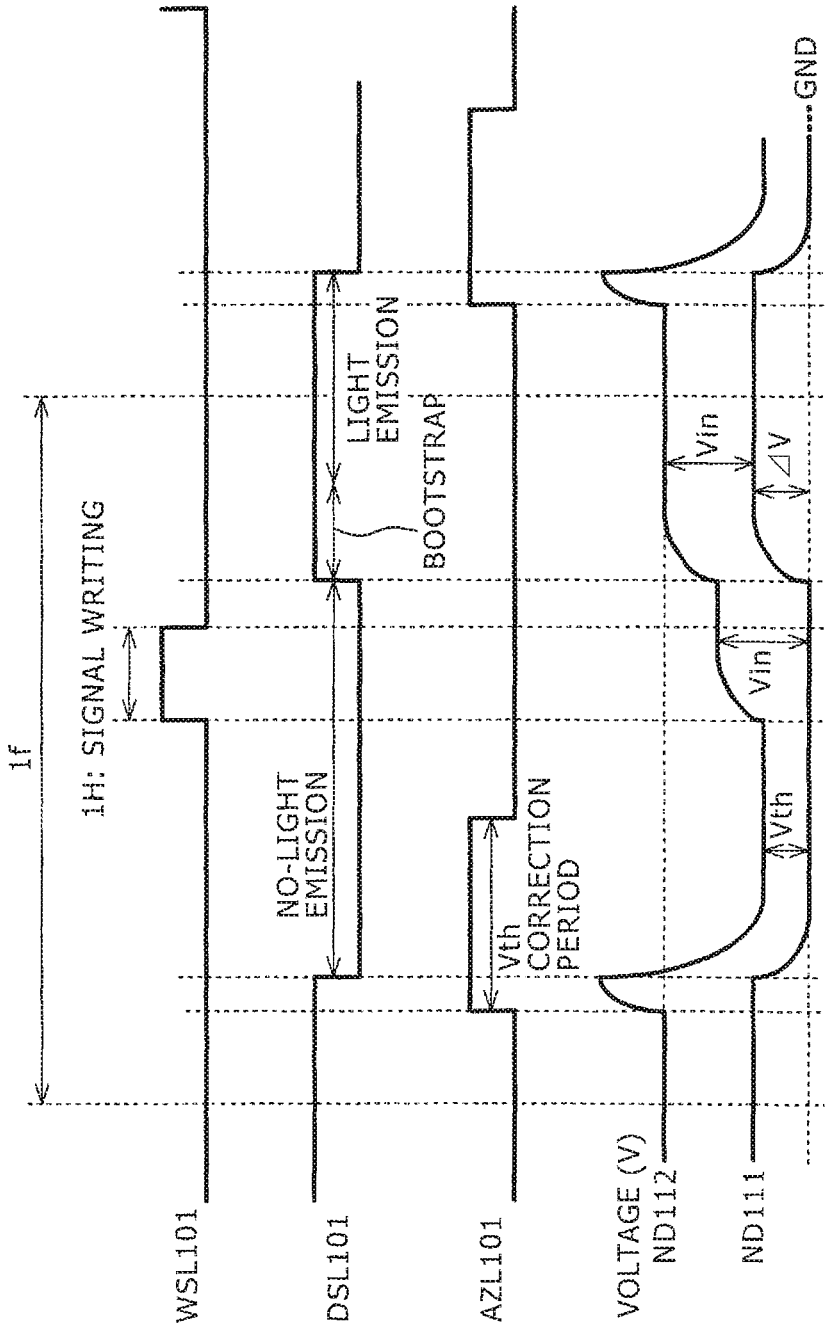
FIG. 5 is a timing chart illustrating operation of the pixel circuit shown in FIG. 4.

FIG. 5 illustrate operation of the pixel circuit shown in FIG. 4. The pixel circuit performs threshold voltage Vth correction, signal writing and bootstrap operation in order within a period of one field (1f). The threshold voltage Vth correction and the signal writing are performed within a no-light emission period of 1f, and the boot strap operation is performed at the top of a light emission period. Further, within the threshold voltage Vth correction period, the scanning line AZL101 builds up to the high level while the scanning line DSL101 remains at the high level. Consequently, the switching transistors 112 and 113 are turned on simultaneously, and therefore, current flows and the potential at the node ND112 connecting to the gate of the TFT 111 rises. Thereafter, the scanning line DSL101 falls to the low level, and consequently, the light emitting element 117 is placed into a no-light emitting state. Consequently, charge accumulated at the node ND112 is discharged through the switching transistor 113, and the potential at the node ND112 drops gradually. Then, when the potential difference between the node ND112 and the node ND111 becomes equal to the threshold voltage Vth, the current through the TFT 111 stops. As can be seen apparently from FIG. 5, the potential difference between the node ND112 and the node ND111 corresponds to the gate-source voltage Vgs, and from the expression (1), when Vgs=Vth is reached, the current value Ids becomes equal to 0. As a result, the threshold voltage Vth between the nodes ND112 and ND111 is held by the capacitor C111.

Then, the scanning line WSL101 exhibits the high level within a period of 1H, and within the period, the sampling transistor 115 conducts and writing of a signal is performed. In particular, a video signal Vsig supplied to the signal line DTL101 is sampled by the sampling transistor 115 and written into the capacitor C111 through the coupling capacitor C112. As a result, the held potential Vin of the capacitor C111 becomes equal to the sum of the threshold voltage Vth written formerly and the video signal Vsig. However, the input gain of the video signal Vsig is not 100% but exhibits some loss.

Thereafter, the scanning line DSL101 builds up to the high level and emission of light is started, and the bootstrap operation is performed. Consequently, the signal potential Vin applied to the gate of the drive transistor 111 rises by ΔV in accordance with the I-D characteristic of the EL light emitting element 117. In this manner, the pixel circuit of FIG. 4 adds the threshold voltage Vth and the voltage ΔV to the net signal component applied to the gate of the drive transistor 111. Even if the threshold voltage Vth and the voltage ΔV vary, since the influence of the variation can be cancelled, the light emitting element 117 can be driven stably.

Figure 6:
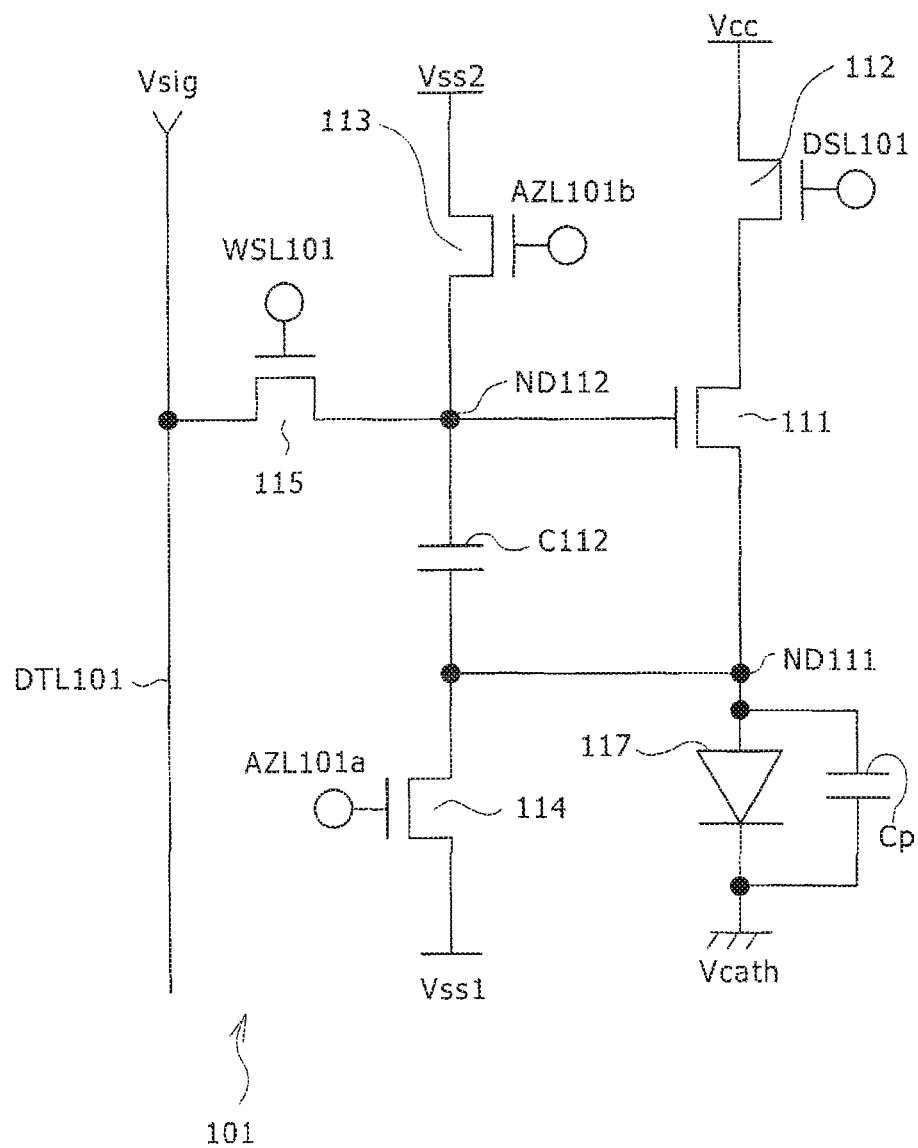
FIG. 6 is a circuit diagram showing a configuration of a pixel circuit to which the present invention is applied.

FIG. 6 shows a pixel circuit to which the present invention is applied and which is composed of a number of elements reduced from that of the pixel circuit described hereinabove with reference to FIG. 4. Referring to FIG. 6, the present pixel circuit 101 is disposed at each of points at which scanning lines and signal lines intersect with each other and can be applied to a display apparatus of the active matrix type. While the number of signal lines is only one which is the signal line DTL101, the number of scanning lines is four including scanning lines WSL101, DSL101, AZL101a and AZL101b disposed in parallel to each other. The pixel circuit 101 is composed of five N-channel thin film transistors including an electro-optical element 117, a capacitor C111, a sampling transistor 115, a drive transistor 111, a switching transistor 112, a first detection transistor 114 and a second detection transistor 113. In this manner, the pixel circuit 101 is composed of one holding capacitor and five transistors, and when compared with the pixel circuit shown in FIG. 4, the number of capacitance elements is smaller by one and also the number of transistors is smaller by one. Since the number of component elements is smaller, the yield can be enhanced and the cost can be reduced as much.

The holding capacitor C111 is connected at one terminal thereof to the source of the drive transistor 111 and at the other terminal thereof to the gate of the drive transistor 111 similarly. In FIG. 6, the gate of the drive transistor 111 is represented by the node ND112, and the source of the drive transistor 111 is represented by the node ND111 similarly. Accordingly, the holding capacitor C111 is connected between the node ND111 and the node ND112. The electro-optical element 117 is formed from, for example, an organic EL element of a diode structure and has an anode and a cathode. The organic EL element 117 is connected at the anode thereof to the source (node ND111) of the drive transistor 111 and at the cathode thereof to a predetermined cathode potential Vcath. It is to be noted that the organic EL element 117 includes a capacitance component between the anode and the cathode thereof, and the capacitance component is represented by Cp.

The first detection transistor 114 is connected at the source thereof to a first ground potential Vss1 and at the drain thereof to the source (node ND111) of the drive transistor 111. The first detection transistor 114 is further connected at the gate thereof to a scanning line AZL101a. The second detection transistor 113 is connected at the source thereof to a second ground potential Vss2 and at the drain thereof to the gate (node ND112) of the drive transistor 111. Further, the second detection transistor 113 is connected at the gate thereof to a scanning line AZL101b.

The sampling transistor 115 is connected at the source thereof to the signal line DTL101, at the drain thereof to the gate (node ND112) of the drive transistor 111 and at the gate thereof to the scanning line WSL101. The switching transistor 112 is connected at the drain thereof to the power supply potential Vcc, at the source thereof to the drain of the drive transistor 111, and at the gate thereof to the scanning line DSL101. The scanning lines AZL101a, AZL101b and DSL101 are disposed in parallel to the scanning line WSL101 and are scanned line sequentially at suitable timings by the peripheral scanners.

The sampling transistor 115 operates when it is selected by the scanning line WSL101 to sample an input signal Vsig from the signal line DTL101 and place the sampled input signal Vsig into the holding capacitor C111 through the node ND112. The drive transistor 111 drives the electro-optical element 117 with current in response to the signal potential Vin held in the holding capacitor C111. The switching transistor 112 is rendered conducting when it is selected by the scanning line DSL101 to supply current from the power supply potential Vcc to the drive transistor 111. The first detection transistor 114 and the second detection transistor 113 operate when they are selected by the scanning lines AZL101a and AZL101b, respectively, to detect the threshold voltage Vth of the drive transistor 111 prior to the current driving of the electro-optical element 117 and place the detected potential into the holding capacitor C111 in order to cancel an influence of the threshold voltage Vth.

As a condition for securing normal operation of the pixel circuit 101, the first ground potential Vss1 is set lower than a level calculated by subtracting the threshold voltage Vth of the drive transistor from the second ground potential Vss2. In other words, the first ground potential Vss1 is set so as to satisfy Vss1<Vss2−Vth. Further, a level calculated by adding a threshold voltage VthEL of the organic EL element 117 to the cathode potential Vcath is set higher than another level calculated by subtracting the threshold voltage Vth of the drive transistor 111 from the first ground potential Vss1. Where this is represented by an expression, Vcath+VthEL>Vss1−Vth. Preferably, the level of the second ground potential Vss2 is set to a value in the proximity of the lowest level of the input signal Vsig supplied from the signal line DTL101.

Figure 7:
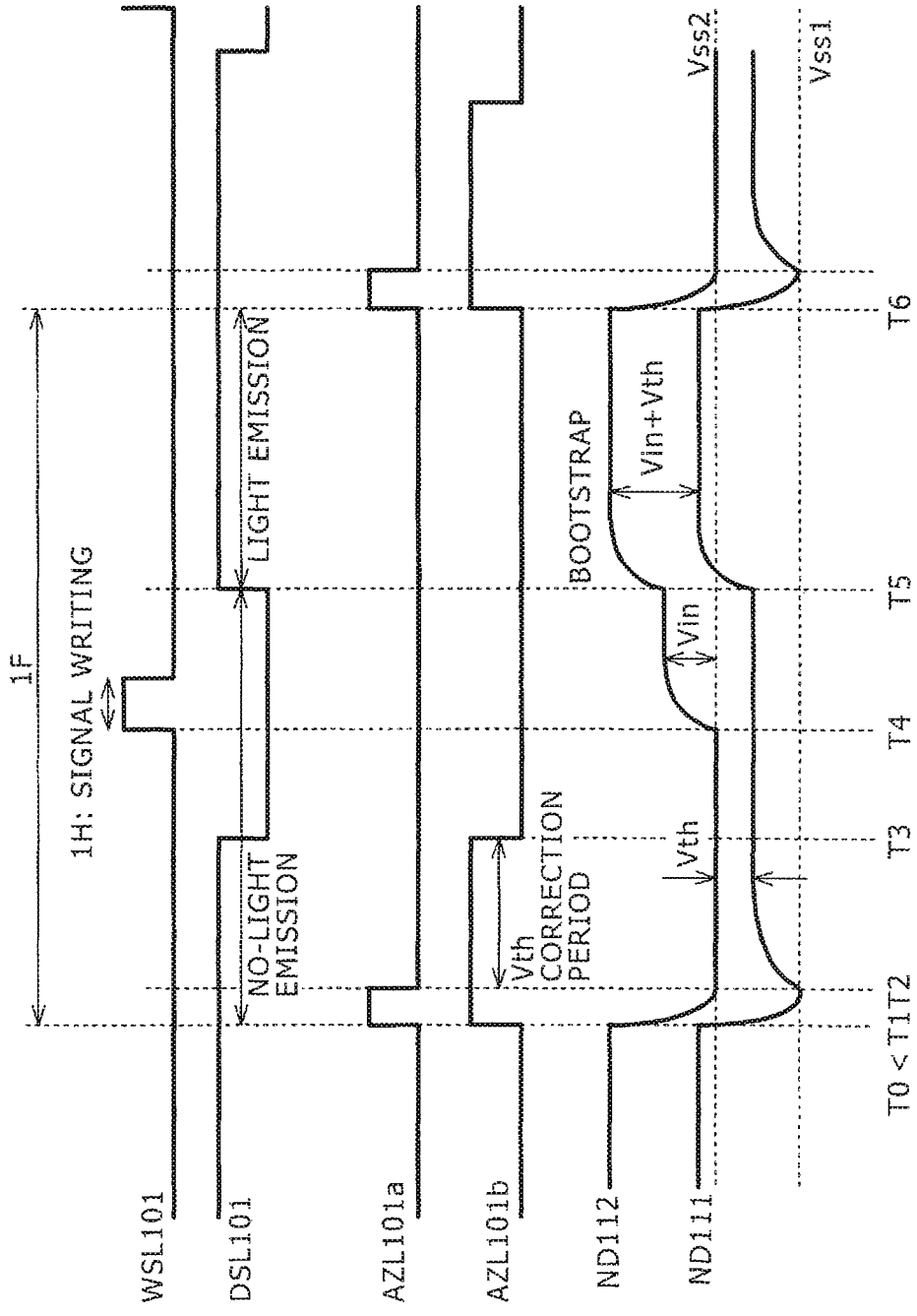
FIG. 7 is a timing chart illustrating operation of the pixel circuit shown in FIG. 6.

Operation of the pixel circuit shown in FIG. 6 is described in detail with reference to a timing chart of FIG. 7. The timing chart of FIG. 7 is represented such that one field (1F) starts at timing T1 and ends at another timing T6. At timing T0 before the field is entered, the scanning lines WSL101, AZL101a and AZL101b have the low level while the scanning line DSL101 has the high level. Accordingly, the switching transistor 112 is in an on state while the sampling transistor 115 and the detection transistors 113 and 114 in pair are in an off state. At this time, the drive transistor 111 supplies driving current in response to the signal potential appearing at the node ND112 to energize the electro-optical element 117 to emit light. At this time, the source potential of the drive transistor 111 (potential at the node ND111) is held at a predetermined working point. The timing chart of FIG. 7 illustrates the potential at the node ND112 and the potential at the node ND111, which represent variation of the gate potential and the source potential of the drive transistor 111, respectively.

At timing T1, both of the scanning lines AZL101a and AZL101b build up from the low level to the high level. As a result, both of the first detection transistor 114 and the second detection transistor 113 change over from an off state to an on state. As a result, the potential at the node ND112 drops to the second ground potential Vss2 quickly, and also the potential at the node ND111 drops to the first ground potential Vss1 quickly. At this time, since the first ground potential Vss1 and the second ground potential Vss2 are set so as to satisfy Vss1<Vss2−Vth as described hereinabove, the drive transistor 111 keeps the on state and drain current Ids flows. At this time, since the relationship of Vcath+Vth (EL)>Vss1−Vth is satisfied, the organic EL element 117 is in a reversely biased state and no current flows therethrough. Accordingly, the organic EL element 117 is placed into a no-light emission state. The drain current Ids of the drive transistor 111 flows to the first ground potential Vss1 side through the first detection transistor 114 which is in an on state.

Then at timing T2, the scanning line AZL101a changes over from the high level to the low level, and consequently, the first detection transistor 114 changes over from an on state to an off state. As a result, the current path of the drain current Ids flowing through the drive transistor 111 is interrupted, and the potential at the node ND111 rises gradually. When the difference between the potential at node ND111 and the potential at node ND112 becomes equal to the threshold voltage Vth, the drive transistor 111 changes over from an on state to an off state and the drain current Ids stops. The potential difference Vth appearing between the node ND111 and the node ND112 is held by the holding capacitor C111. In this manner, the first and second detection transistors 114 and 113 operate when they are selected at suitable timings by the scanning lines AZL101*a* and AZL101*b*, respectively, and detect the threshold voltage Vth of the drive transistor 111 and place the threshold voltage Vth into the holding capacitor C111.

Thereafter, at timing T3, the scanning line AZL101*b* changes over from the high level to the low level, and also the scanning line DSL101 changes over from the high level to the low level at a substantially same timing. As a result, the second detection transistor 113 and the switching transistor 112 change over from an on state to an off state. On the timing chart of FIG. 7, the period of time from timing T2 to timing T3 is denoted by Vth correction period, and the detected threshold voltage Vth of the drive transistor 111 is held as a correction potential in the holding capacitor C111.

Thereafter, at timing T4, the scanning line WSL101 builds up from the low level to the high level. Consequently, the sampling transistor 115 is rendered conducting, and the input potential Vin is written into the holding capacitor C111. The input potential Vin is held in such a form that it is added to the threshold voltage Vth of the driving transistor. As a result, the variation of the threshold voltage Vth of the drive transistor 111 is always cancelled, and therefore, this signifies that Vth correction is performed. It is to be noted that the input potential Vin written into the holding capacitor C111 is represented by the following expression:

$$Vin = Cp/(Cs+Cp) \times (Vsig - Vss2)$$

where Cs is the capacitance value of the holding capacitor C111, and Cp the capacitance component of the organic EL element 117 as described hereinabove. Usually, the capacitance component Cp of the organic EL element 117 is much higher than the capacitance value Cs of the holding capacitor C111. Accordingly, the input potential Vin is substantially equal to Vsig−Vss2. In this instance, if the second ground potential Vss2 is set to a value in the proximity of the black level of the input signal Vsig, then the input signal Vin becomes substantially equal to the input signal Vsig.

Thereafter, the scanning line WSL101 changes over from the high level back to the low level thereby to end the sampling of the input signal Vsig. Then at timing T5, the scanning line DSL101 builds up from the low level to the high level and the switching transistor 112 is placed into an on state. Consequently, driving current is supplied from the power supply potential Vcc to the drive transistor 111 to start a light emitting operation of the organic EL element 117. Since current flows through the organic EL element 117, a voltage drop appears and the potential at the node ND111 rises. In response to the potential rise, also the potential at the node ND112 rises, and consequently, the gate potential Vgs of the drive transistor 111 is always kept at Vin+Vth irrespective of the potential rise at the node ND111. As a result, the organic EL element 117 continues to emit light with a luminance corresponding to the input voltage Vin. When the scanning lines AZL101*a* and AZL101*b* build up at timing T6 at the end of the one field, the threshold voltage Vth correction period of the next field is entered and also the emission of light from the electro-optical element 117 stops.

Figure 8:
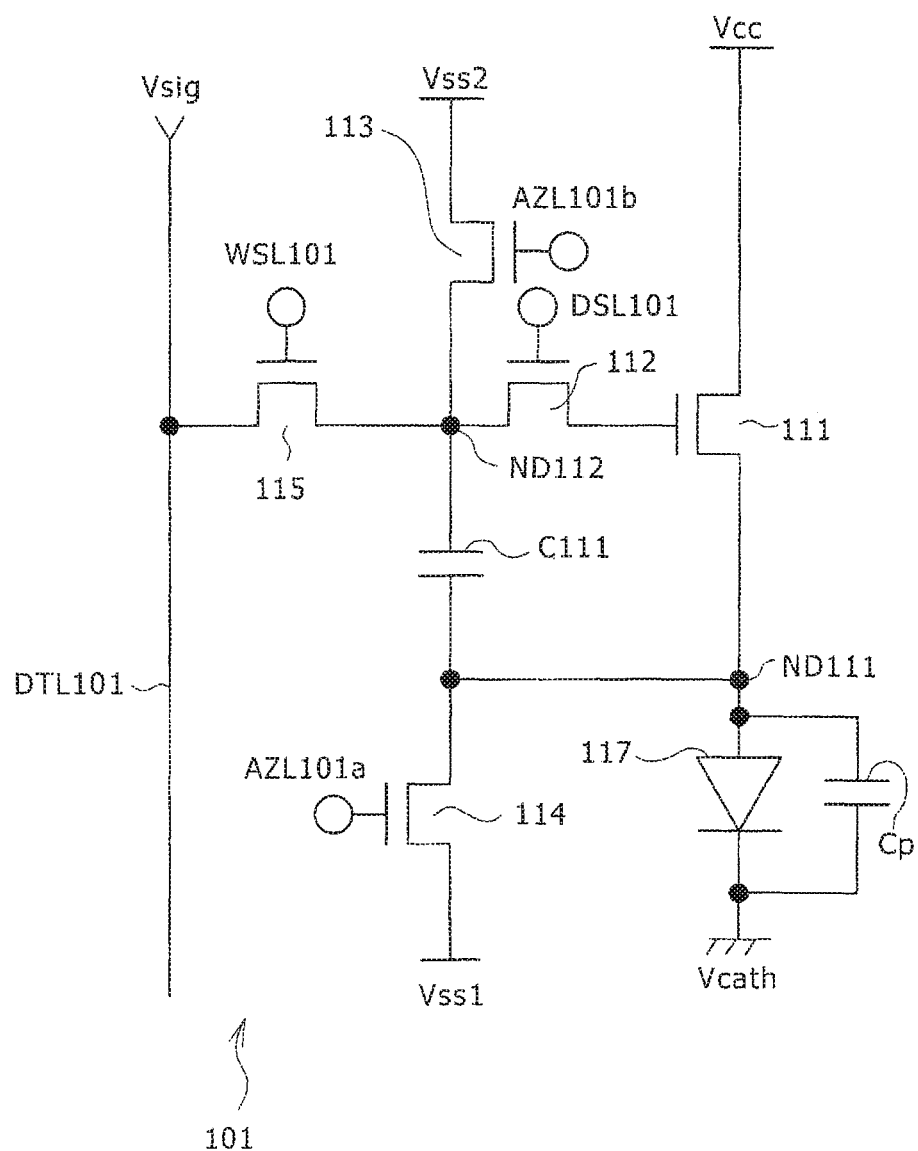
FIG. 8 is a circuit diagram showing a configuration of another pixel circuit to which the present invention is applied.

FIG. 8 shows a pixel circuit according to another embodiment of the present invention. Referring to FIG. 8, the present pixel circuit 101 is disposed at each of points at which scanning lines and signal lines intersect with each other and can be applied to a display apparatus of the active matrix type. While the number of signal lines is only one which is the signal line DTL101, the number of scanning lines is four including scanning lines WSL101, DSL101, AZL101*a* and AZL101*b* disposed in parallel to each other. The pixel circuit 101 is basically composed of five N-channel thin film transistors including an electro-optical element 117, a holding capacitor C111, a sampling transistor 115, a drive transistor 111, a switching transistor 112, a first detection transistor 114 and a second detection transistor 113. When compared with the pixel circuit shown in FIG. 1, the number of capacitance elements is smaller by one and also the number of transistors is smaller by one. Since the pixel circuit implemented is composed of one capacitance element and five transistors, the yield can be enhanced and the cost can be reduced when compared with the conventional pixel circuit.

The drive transistor 111 is connected at the gate thereof to the input node ND112, at the source thereof connected to the output node ND111, and at the drain thereof to the predetermined power supply potential Vcc. The electro-optical element 117 is formed from an organic EL element of a diode type and has an anode and a cathode. The electro-optical element 117 is connected at the anode thereof to the output node ND111 and at the cathode thereof to a predetermined cathode potential Vcath. The organic EL element 117 includes a capacitance component in parallel to a resistance component, and the capacitance component is represented by Cp. The holding capacitor C111 is connected between the output node ND111 and the input node ND112. The potential difference between the output node ND111 and the input node ND112 is just equal to the gate potential Vgs of the drive transistor 111. The sampling transistor 115 is connected at the source thereof to the signal line DTL101, at the drain thereof to the input node ND112, and at the gate thereof to the scanning line WSL101.

The first detection transistor 114 is connected at the source thereof to the first ground potential Vss1, at the drain thereof to the output node ND111, and at the gate thereof to the scanning line AZL101*a*. The second switching transistor 113 is connected at the source thereof to the second ground potential Vss2, at the drain thereof to the input node ND112, and at the gate thereof to the scanning line AZL101*b*. The switching transistor 112 is connected at the source/drain thereof between the input node ND112 and the gate of the drive transistor 111. The switching transistor 112 is connected at the gate thereof to the scanning line DSL101. While, in the example for reference shown in FIG. 4, the switching transistor is connected between the power supply potential Vcc and the drive transistor, in the present embodiment, the switching transistor 112 is connected between the input node and the gate of the drive transistor. According to the present embodiment, since the drive transistor 111 can be connected directly to the power supply potential Vcc, surplus power consumption can be avoided. Further, since the switching transistor 112 is connected to the gate of the drive transistor 111, it need not have a high current supplying capacity and hence can be miniaturized.

The sampling transistor 115 operates when it is selected by the scanning line WSL101 to sample the input signal Vsig from the signal line DTL101 and place the sampled input signal Vsig into the holding capacitor C111. The switching transistor 112 is rendered conducting when it is selected by the scanning line DSL101 to connect the holding capacitor C111 to the gate of the drive transistor 111. The drive transistor 111 drives the electro-optical element 117 with current in response to the signal potential Vin held in the holding capacitor C111. The first detection transistor 114 and the second switching transistor 113 operate when they are selected by the different scanning lines AZL101a and AZL101b, respectively, to detect the threshold voltage Vth of the drive transistor 111 prior to the current driving of the electro-optical element 117 and place the detected potential into the holding capacitor C111 in order to cancel an influence of the threshold voltage Vth in advance. Consequently, even if the threshold voltage Vth varies, since the variation is always canceled, the drive transistor 111 can supply fixed drain current Ids to the organic EL element 117 without being influenced by the variation of the threshold voltage Vth.

In order to cause the pixel circuit 101 to operate normally, the potential relationship must be set correctly. To this end, the first ground potential Vss1 is set lower than a level calculated by subtracting the threshold voltage Vth of the drive transistor from the second ground potential Vss2. This can be represented by an expression as Vss1<Vss2−Vth. Further, a level calculated by adding the threshold voltage VthEL of the organic EL element 117 to the cathode potential Vcath is set higher than another level calculated by subtracting the threshold voltage Vth of the drive transistor from the first ground potential Vss1. Where this is represented by an expression, Vcath+VthEL>Vss1−Vth. The expression represents that the organic EL element 117 is placed into a reversely biased state. Preferably, the level of the second ground potential Vss2 is set to a value in the proximity of the lowest level of the input signal Vsig supplied from the signal line DTL101. Where the capacitance value of the holding capacitor C111 is represented by Cs, the signal potential Vin held by the holding capacitor C111 is represented by the following expression:

$$Vin=(Vsig-Vss2)\times(Cp/(Cs+Cp))$$

The capacitance component Cp of the organic EL element 117 is much higher than the value Cs of the holding capacitor, and the signal potential Vin is substantially equal to Vsig−Vss2. Here, since the second ground potential Vss2 is set to a level in the proximity of the lowest level of the input signal Vsig, the signal potential Vin held by the holding capacitor C111 is substantially equal to the net value of the input signal Vsig.

Figure 9:
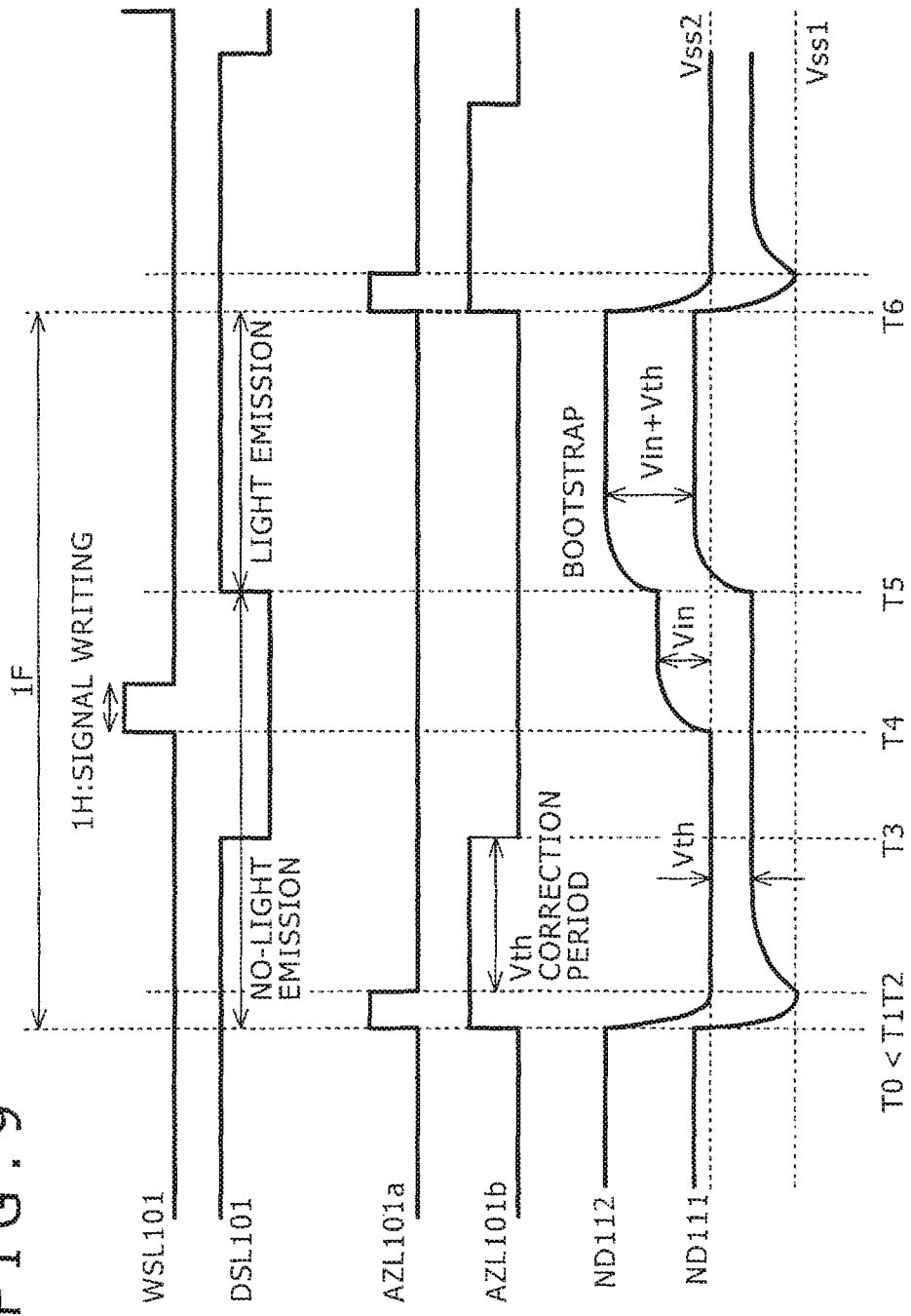
FIG. 9 is a timing chart illustrating operation of the pixel circuit shown in FIG. 8.
Figure 10:
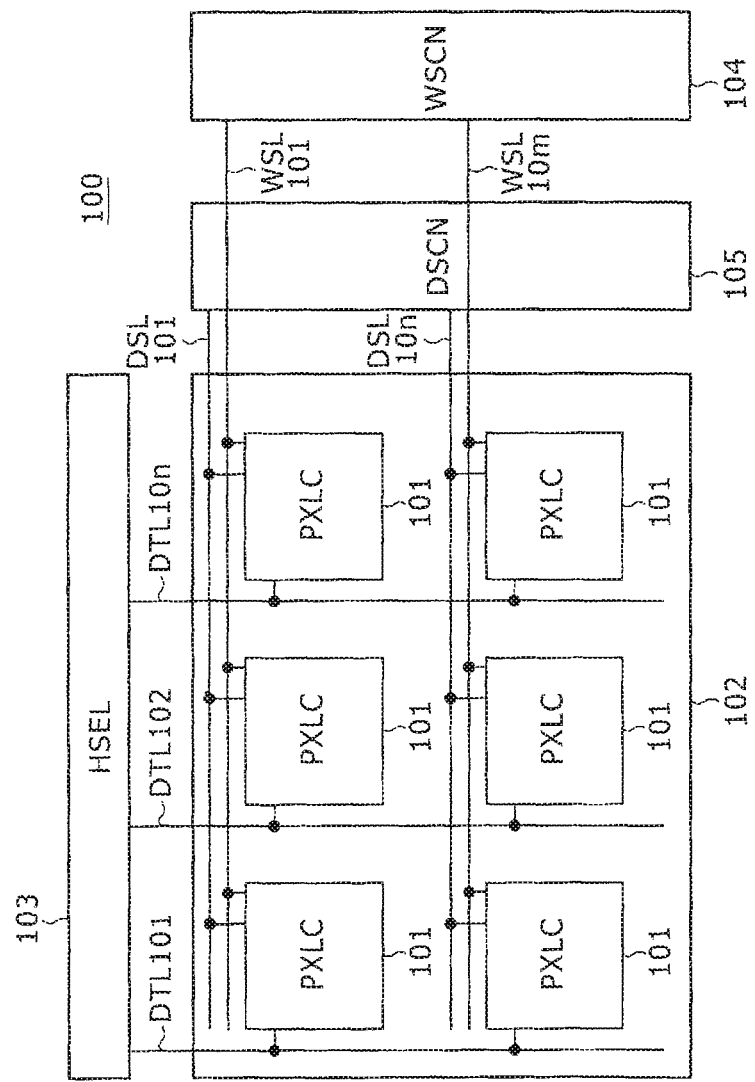
FIG. 10 is a block diagram showing a configuration of a conventional organic EL display apparatus.
Figure 11:
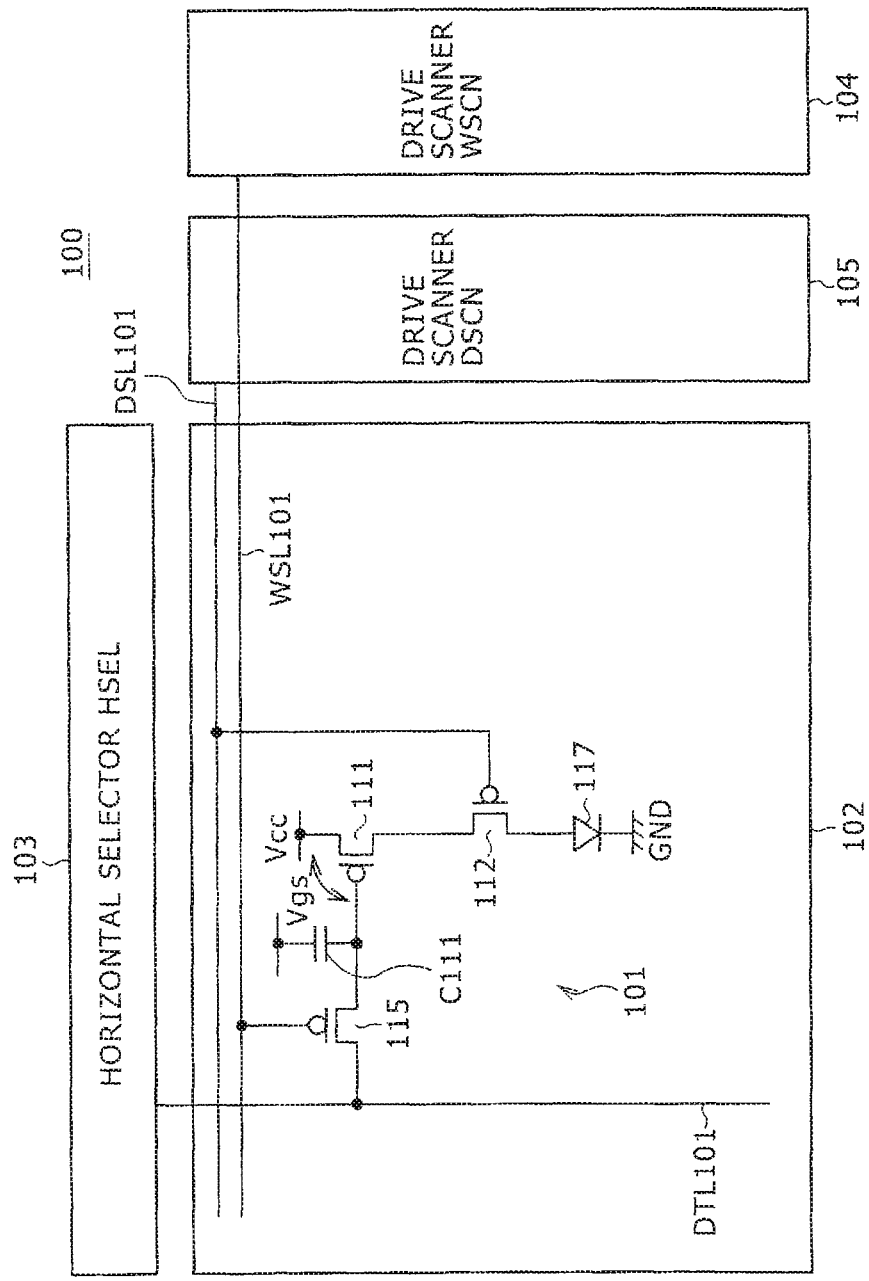
FIG. 11 is a circuit diagram showing an example of a conventional pixel circuit.
Figure 12:
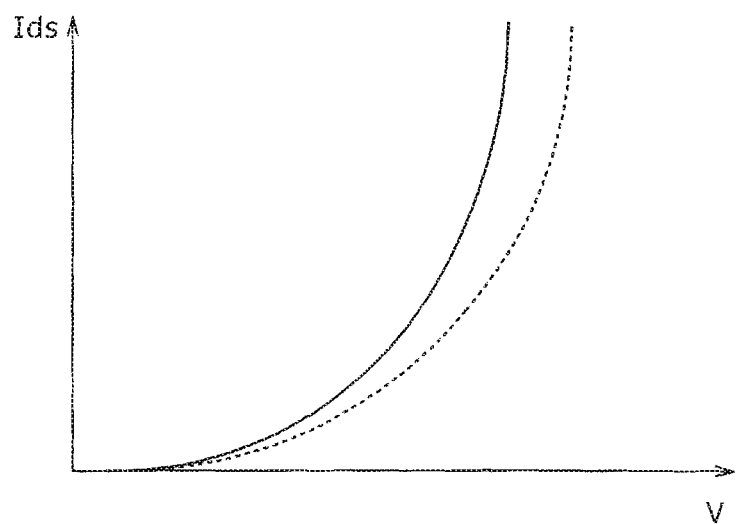
FIG. 12 is a graph illustrating aged deterioration of a characteristic of an EL element.
Figure 13:
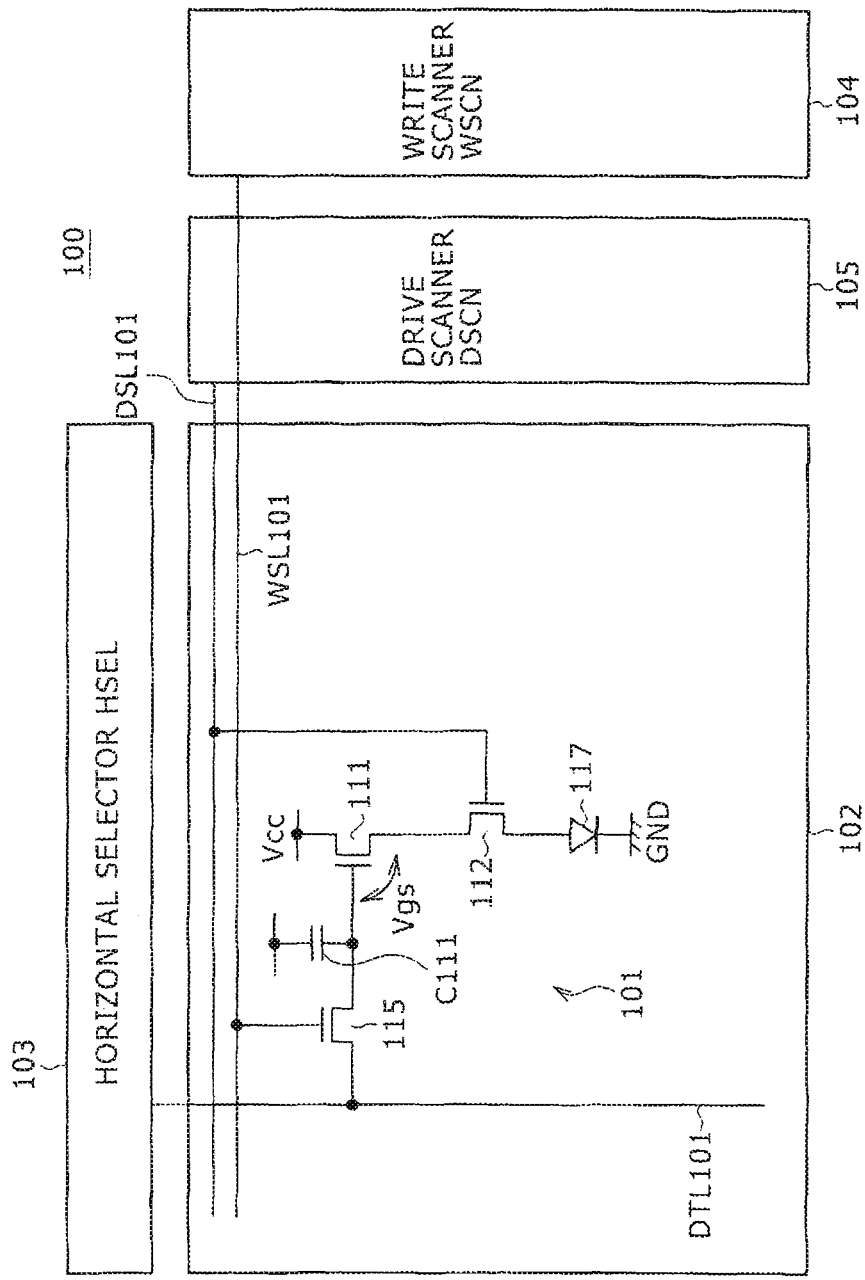
FIG. 13 is a circuit diagram showing another example of a conventional pixel circuit.
Figure 15A:
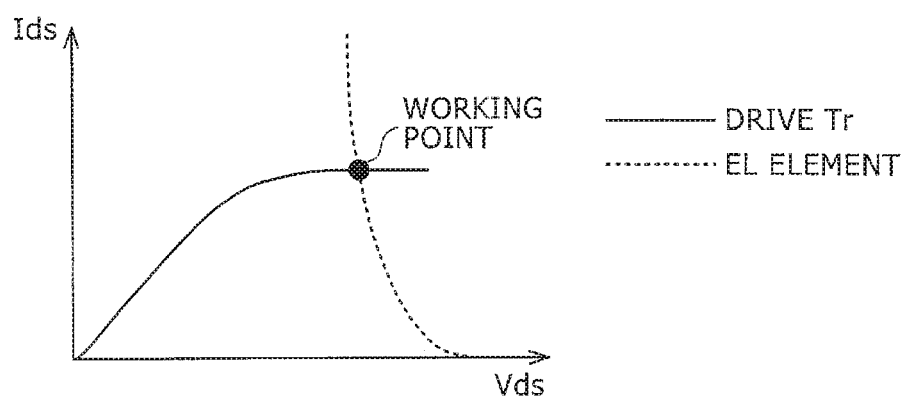
FIGS. 15A and 15B are graphs illustrating a working point of a drive transistor and an EL element.
Figure 15B:
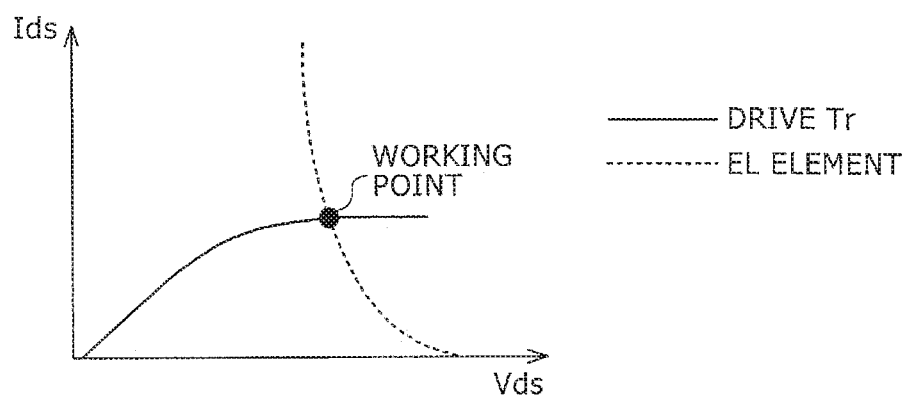

Operation of the pixel circuit shown in FIG. 8 is described in detail with reference to FIG. 9. The timing chart of FIG. 9 indicates level variation of the four scanning lines WSL101, DSL101, AZL101a and AZL101b within a period of one field (1F). The timing chart further indicates potential variation at the input node ND112 and the output node ND111 of the drive transistor 111 within a period of one field. One field (1F) starts at timing T1 and ends at another timing T6.

At timing T0 before the field is entered, the scanning line DSL101 has the high level while the remaining scanning lines WSL101, AZL101a and AZL101b have the low level. Accordingly, the switching transistor 112 is in an on state while the remaining sampling transistor 115, first detection transistor 114 and second detection transistor 113 are in an off state. In this state, the signal potential Vin held by the holding capacitor C111 is applied to the gate of the drive transistor 111 through the switching transistor 112 which is in a conducting state. Accordingly, the drive transistor 111 supplies drain current Ids in accordance with the signal potential Vin to the organic EL element 117. As a result, the organic EL element 117 emits light with a luminance corresponding to the video signal Vsig.

Then at timing T1, both of the scanning lines AZL101a and AZL101b change over from the low level to the high level at the same time. As a result, both of the first detection transistor 114 and the second detection transistor 113 are turned on simultaneously. As the second detection transistor 113 is turned on, the potential at the input node ND112 drops to the second ground potential Vss2 quickly. Further, as the first detection transistor 114 is turned on, the potential at the output node ND111 drops down to the first ground potential Vss1 quickly. As a result, while the gate potential Vgs of the drive transistor 111 is given by Vss2−Vss1, since this value is higher than the threshold voltage Vth of the drive transistor 111, the drive transistor 111 keeps the on state and the drain current Ids flows. On the other hand, since the potential at the output node ND111 drops to the first ground potential Vss1, the organic EL element 117 is placed into a reversely biased state and no current flows therethrough. Accordingly, the organic EL element 117 is placed into a no-light emission state. The drain current Ids of the drive transistor 111 flows to the first ground potential Vss1 through the first detection transistor 114 which is in an on state.

Then at timing T2, the scanning line AZL101a changes over from the high level to the low level, and consequently, the first detection transistor 114 is placed into an off state. As a result, the current path to the drive transistor 111 is interrupted, and the potential at the output node ND111 rises gradually. When the potential difference between the output node ND111 and the input node ND112 becomes equal to the threshold voltage Vth of the drive transistor 111, the current becomes equal to zero and the threshold voltage Vth is held by the holding capacitor C111 connected between the nodes ND112 and ND111. The threshold voltage Vth of the drive transistor 111 is detected by the pair of detection transistors 113 and 114 and held by the holding capacitor C111 in this manner. The period of time from timing T2 to timing T3 within which the operation described above is performed is represented by a Vth correction period. It is to be noted that the timing T3 represents a timing at which the scanning line DSL101 and the scanning line AZL101b change over from the high level to the low level after the current reduces to zero. As a result, the switching transistor 112 is placed once into an off state and also the second detection transistor 113 is placed into an off state. Consequently, the input node ND112 is disconnected from the gate of the drive transistor 111 and also from the second ground potential Vss2 and therefore can thereafter perform sampling operation.

At timing T4, the scanning line WSL101 builds up to the high level and the sampling transistor 115 is turned on. Consequently, the input signal Vsig supplied from the signal line DTL101 is sampled, and the input potential Vin which is substantially equal to the net value of the input signal Vsig is written into the holding capacitor C111. The input potential Vin is held in such a form that it is added to the threshold voltage Vth held formerly.

At timing T5 after the sampling of the video signal Vsig comes to an end in this manner, the scanning line DSL101 builds up to the high level again and the switching transistor 112 is placed into an on state so that emission of light from the organic EL element 117 is started. In particular, the input potential Vin held in the holding capacitor C111 is applied to the gate of the drive transistor 111 through the switching transistor 112. The drive transistor 111 supplies the drain current Ids in accordance with the input potential Vin to the organic EL element 117 to start emission of light from the organic EL element 117. After the current begins to flow through the organic EL element 117, a voltage drop occurs, and the level at the output node ND111 begins to rise. Simultaneously, since also the level at the input node ND112 begins to rise, the potential Vin+Vth held in the holding capacitor C111 remains fixed. By such a bootstrap operation as described above, even if the level at the output node ND111 varies by variation of the working point of the organic EL element 117, the drive transistor 111 can supply normally fixed drain current Ids. At timing T6, the scanning lines AZL101a and AZL101b build up finally, and threshold voltage Vth detection operation for a next field is started.

While preferred embodiments of the present invention have been described using specific terms, such description is for illustrative purpose only, and it is to be understood that changes and variations may be made without departing from the spirit or scope of the following claims.

What is claimed is:

1. A display apparatus comprising
at least one of pixel including:
an electro-optical element;
a sampling transistor;
a drive transistor;
a holding capacitor including a first electrode electrically connected to a gate of the drive transistor and a second electrode electrically connected to a source of the drive transistor;
a first switching transistor electrically connected between a first voltage line and the drive transistor;
a second switching transistor electrically connected between the gate of the drive transistor and a second voltage line, one of a source or a drain of the second switching transistor being electrically directly connected to the gate of the drive transistor, the first electrode and one of a source or a drain of the sampling transistor, the other of the source or the drain of the second switching transistor being electrically directly connected to the second voltage line; and
a third switching transistor electrically connected to an anode of the electro-optical element,
wherein the sampling transistor is configured to supply a video signal from a signal line to the holding capacitor when the sampling transistor is an on state,
wherein the drive transistor is configured to supply driving current from the first voltage line to the electro-optical element according to a voltage stored in the holding capacitor,
wherein a gate of the first switching transistor and a gate of the sampling transistor are connected to different control signal lines, and
wherein the gate of the first switching transistor and a gate of the third switching transistor are connected to different control signal lines.

2. The display apparatus of claim 1, wherein a potential of the second voltage line is lower than a potential of the first voltage line.

3. The display apparatus of claim 1, wherein the third switching transistor is connected between the anode of the electro-optical element and a third voltage line, and a potential of the third voltage line is lower than the potential of the first voltage line.

4. The display apparatus of claim 1, wherein a gate of the second switching transistor is connected to a first control signal line, and a gate of the third switching transistor is connected to a second control signal line.

5. The display apparatus of claim 4, wherein the gate of the first switching transistor is connected to a third control signal line.

6. The display apparatus of claim 5, wherein the gate of the sampling transistor is connected to a fourth control signal line.

7. The display apparatus of claim 1, wherein each of the sampling transistor, the drive transistor, the first switching transistor, the second switching transistor and the third switching transistor is an n-channel type transistor.

8. The display apparatus of claim 1, wherein the source of the drive transistor is connected to the anode of the electro-optical element.

9. The display apparatus of claim 1, wherein the gate of the sampling transistor and the gate of the third switching transistor are connected to different control signal lines.

10. The display apparatus of claim 1, wherein the first voltage line is at a first potential and the second voltage line is at a second potential that differs from the first potential.

* * * * *